United States Patent
Otani et al.

(10) Patent No.: US 8,392,199 B2
(45) Date of Patent: Mar. 5, 2013

(54) CLIPPING DETECTION DEVICE AND METHOD

(75) Inventors: Takeshi Otani, Kawasaki (JP); Masakiyo Tanaka, Kawasaki (JP); Yasuji Ota, Kawasaki (JP); Shusaku Ito, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 804 days.

(21) Appl. No.: 12/470,233

(22) Filed: May 21, 2009

(65) Prior Publication Data

US 2010/0030555 A1 Feb. 4, 2010

(30) Foreign Application Priority Data

Jul. 30, 2008 (JP) ................................. 2008-196639

(51) Int. Cl.
*G10L 19/00* (2006.01)

(52) U.S. Cl. ........ 704/500; 715/201; 704/276; 704/270; 704/226; 704/225; 704/207; 455/136; 455/127.1; 381/94.1; 381/71.14; 381/62; 381/56; 379/406.13; 370/210; 361/88; 359/279; 359/237; 359/207.8; 359/199.1; 348/223.1; 347/74; 330/109; 324/458; 250/201.4

(58) Field of Classification Search .............. 455/136, 455/127.1; 381/71.14, 94.1, 62, 56; 379/406.13; 715/201; 704/276, 270, 226, 225, 207; 370/210; 361/88; 359/279, 237, 207.8, 199.1; 348/223.1; 347/74; 330/109; 324/458; 250/201.4; 15/319
See application file for complete search history.

(56) References Cited

U.S. PATENT DOCUMENTS

| | | | | |
|---|---|---|---|---|
| 3,604,852 A * | 9/1971 | Weintraub | | 704/276 |
| 3,673,412 A * | 6/1972 | Olson | | 250/201.4 |
| 3,898,532 A * | 8/1975 | Frank | | 361/88 |
| 4,021,613 A * | 5/1977 | Kennedy | | 381/62 |
| 4,074,204 A * | 2/1978 | Broburg et al. | | 330/109 |
| 4,168,508 A * | 9/1979 | Gilbert | | 381/56 |
| 4,335,276 A * | 6/1982 | Bull et al. | | 704/276 |
| 4,935,963 A * | 6/1990 | Jain | | 704/207 |
| 5,282,024 A * | 1/1994 | Takei | | 348/223.1 |
| 5,737,432 A * | 4/1998 | Werrbach | | 381/94.1 |
| 5,754,973 A | 5/1998 | Akune | | |
| 5,875,448 A * | 2/1999 | Boys et al. | | 715/201 |
| 5,890,111 A * | 3/1999 | Javkin et al. | | 704/226 |
| 6,044,338 A | 3/2000 | Akune | | |
| 6,167,133 A * | 12/2000 | Caceres et al. | | 379/406.13 |
| 6,801,895 B1 * | 10/2004 | Huang et al. | | 704/270 |
| 6,889,186 B1 * | 5/2005 | Michaelis | | 704/225 |

(Continued)

FOREIGN PATENT DOCUMENTS

| | | |
|---|---|---|
| JP | 5-183364 | 7/1993 |
| JP | 7-326140 | 12/1995 |

(Continued)

OTHER PUBLICATIONS

Japanese Office Action issued Oct. 30, 2012 in corresponding Japanese Patent Application No. 2008-196639.

*Primary Examiner* — Michael Colucci
(74) *Attorney, Agent, or Firm* — Staas & Halsey LLP

(57) ABSTRACT

A clipping detection device calculates an amplitude distribution of an input signal for each predetermined period, calculates a deflection degree of the distribution on the basis of the calculated amplitude distribution, and then detects clipping of a communication signal on the basis of the calculated deflection degree of the distribution.

12 Claims, 19 Drawing Sheets

U.S. PATENT DOCUMENTS

| | | | | |
|---|---|---|---|---|
| 7,145,710 | B2* | 12/2006 | Holmes | 359/279 |
| 7,466,966 | B2* | 12/2008 | Dartois | 455/127.1 |
| 7,920,312 | B2* | 4/2011 | Rosman et al. | 359/199.1 |
| 2002/0138255 | A1 | 9/2002 | Endo et al. | |
| 2002/0172374 | A1* | 11/2002 | Bizjak | 381/71.14 |
| 2003/0042907 | A1* | 3/2003 | Kieres et al. | 324/458 |
| 2004/0061916 | A1* | 4/2004 | Kuba | 359/205 |
| 2004/0162043 | A1* | 8/2004 | Taubenheim et al. | 455/136 |
| 2005/0206688 | A1* | 9/2005 | Gelbart et al. | 347/74 |
| 2006/0187517 | A1* | 8/2006 | Ljungblad | 359/237 |
| 2007/0065162 | A1 | 3/2007 | Kikuchi | |
| 2008/0047092 | A1* | 2/2008 | Schnittman et al. | 15/319 |
| 2009/0034407 | A1* | 2/2009 | Lindh | 370/210 |

FOREIGN PATENT DOCUMENTS

| | | |
|---|---|---|
| JP | 2001-83998 | 3/2001 |
| JP | 2004-356742 | 12/2004 |
| JP | 2006-48590 | 2/2006 |
| WO | 01/39175 | 5/2001 |

* cited by examiner

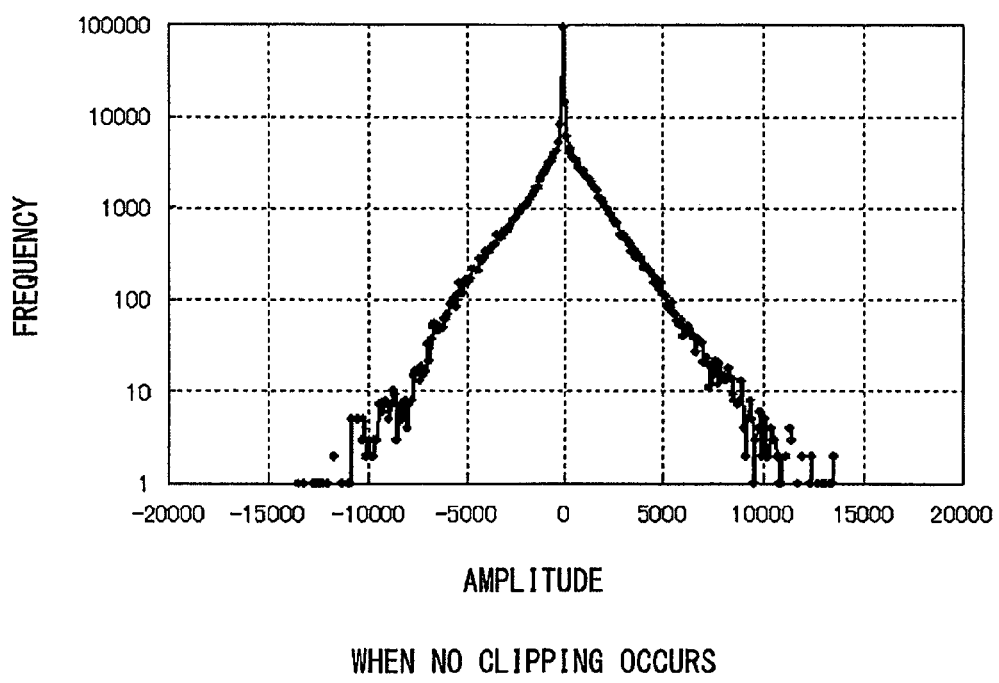
F I G. 5 A

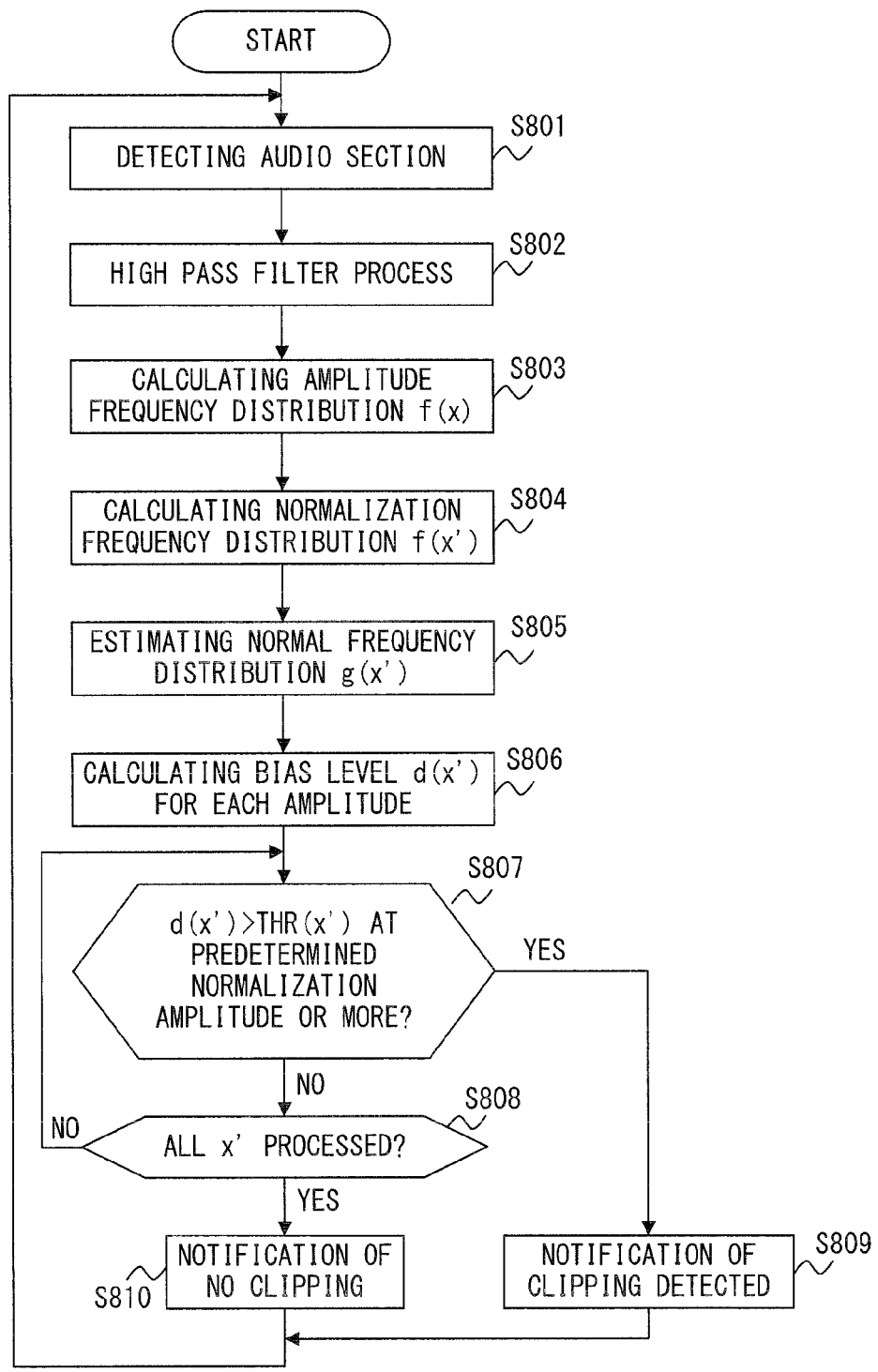
F I G. 1 1

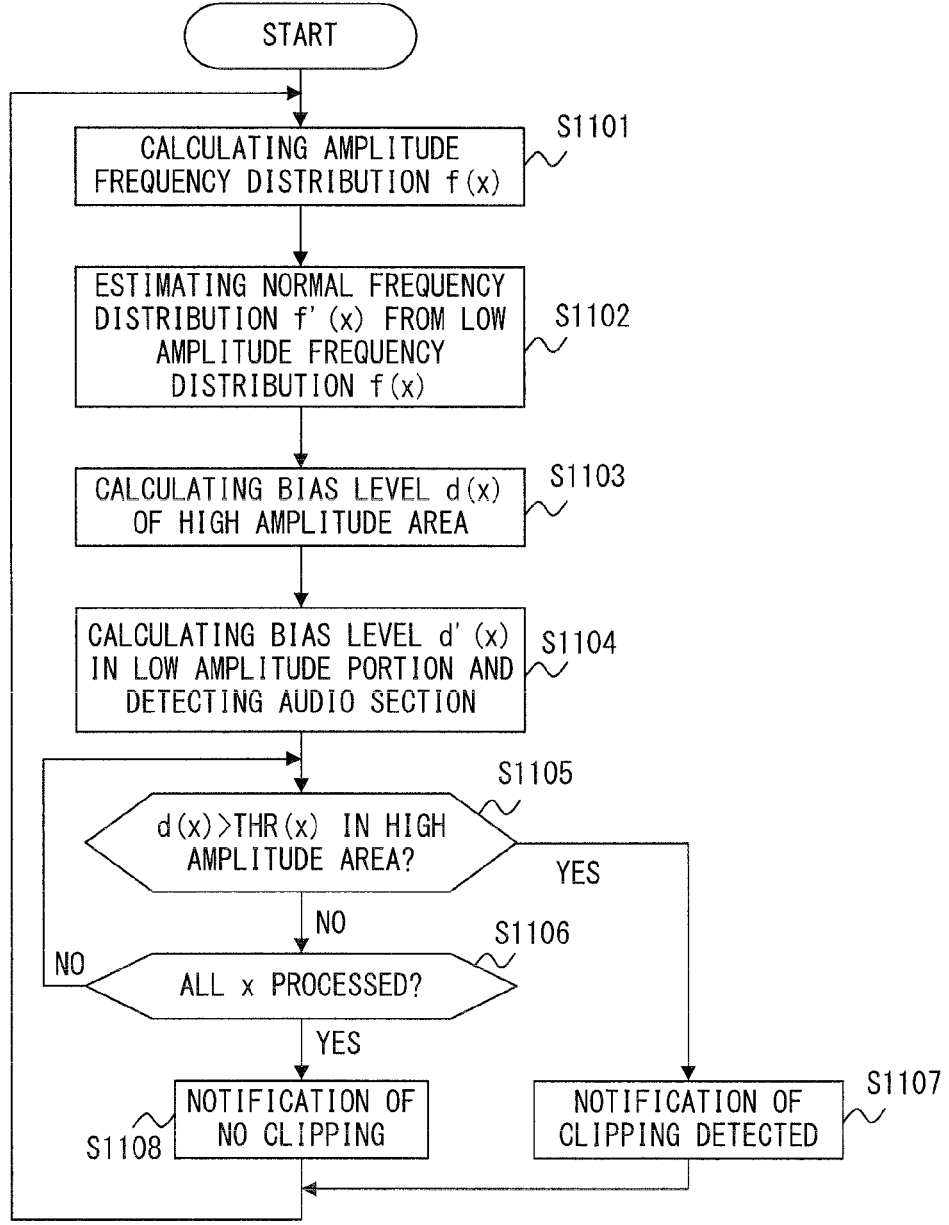
F I G. 14

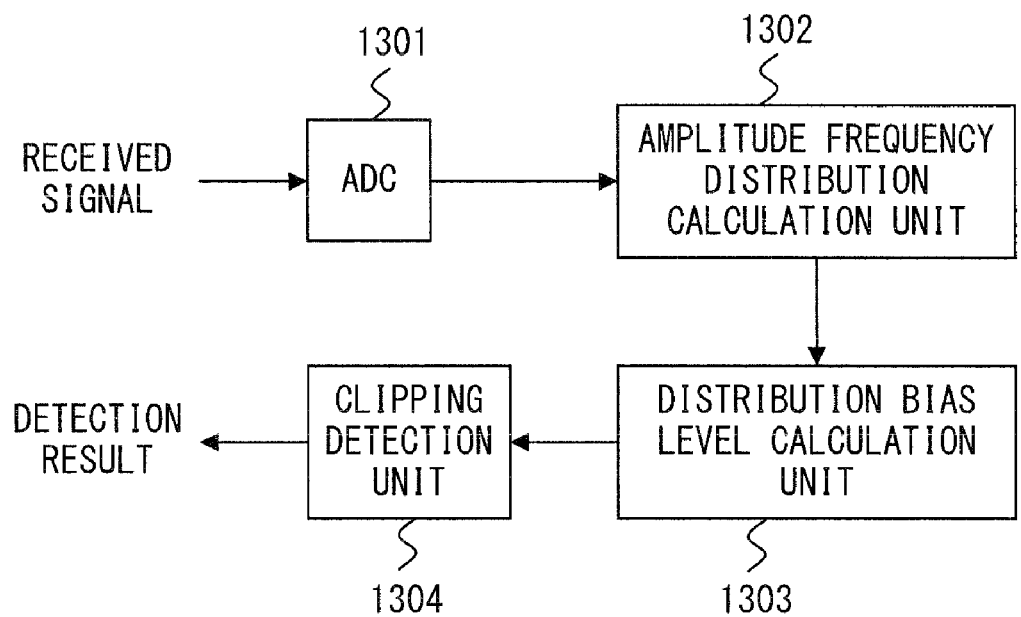
F I G. 16

CLIPPING DETECTION DEVICE AND METHOD

CROSS REFERENCE TO RELATED APPLICATIONS

This application is based upon and claims the benefit of the priority of the prior Japanese Patent Application No. 2008-196639, filed on Jul. 30, 2008, the entire contents of which are incorporated herein by reference.

FIELD

The present invention relates to a method of designating clipping of a waveform in a communication network.

BACKGROUND

When clipping occurs on a path in a telephone line and a VoIP network, harmonic distortion occurs and the audio quality of communications is degraded. For example, as illustrated in FIG. 1, there can occur clipping in any of the amplifiers (amp) 1601, 1602, 1603, etc. on the path. In this case, means for detecting the clipping by monitoring a communication signal during the conversation at any point as indicated by 1604 on the path may be used.

Published technology of the clipping detecting method is described in the following patent document 1. In the prior art, for example as illustrated in FIG. 2, input sound is converted into a digital audio signal by a ADC (A/D converter) 1701 and a digital amplifier 1702 for amplifying the digital audio signal is provided on the path at a transmitter, and the transmitted digital audio signal is converted into an analog audio signal by a DAC (D/A converter) 1703 at a receiver and the analog audio signal is amplified by an analog amplifier 1704, thereby outputting the sound from a speaker.

With the above-mentioned configuration, a clipping period detection unit 1705 compares the maximum value and the minimum value of the amplitude level of a signal with the maximum value and the minimum value of the line of audio distortion as illustrated in FIGS. 3A and 3B using the audio signal (input sound) before the amplification and the amount of amplification in the digital amplifier 1702 or the analog amplifier 1704 at a subsequent stage, and detects the period in which clipping is expected when the amplification is performed by the digital amplifier 1702 or the analog amplifier 1704. Then, on the basis of a detection result, a waveform correction unit 1706 illustrated in FIG. 2 makes a correction to suppress the amplification by the digital amplifier 1702 or the analog amplifier 1704 at the subsequent stage. As a result, an output analog audio signal is corrected from a first analog audio signal AS1 to a second analog audio signal AS2 as illustrated in FIG. 3A→FIG. 3B, thereby moderating the distortion by the clipping.

The related technology is described in, for example, the following patent document 1.

[Patent Document 1] Japanese Laid-open Patent Publication No. 2001-83998

However, the published technology described in the patent document 1 may not detect the clipping unless the amount of amplification by the digital amplifier 1702, the analog amplifier 1704 etc. at the subsequent stage is known, and therefore it may not applicable in monitoring the sound quality on the path of a telephone line.

SUMMARY

According to an aspect of the invention, an amplitude distribution calculation unit calculates the amplitude distribution of an input signal in each period. A deflection degree of the distribution calculation unit calculates a distribution bias level on the basis of the amplitude distribution. The deflection degree of the distribution calculation unit calculates a difference between, for example, a value on the basis of the amplitude distribution calculated by the amplitude distribution calculation unit and a predetermined value of amplitude distribution as a deflection degree of the distribution. Otherwise, the deflection degree of the distribution calculation unit estimates the normal amplitude distribution in the case where no clipping occurs on the basis of the amplitude distribution calculated by the amplitude distribution calculation unit, and calculates a difference between a value based on the amplitude distribution calculated by the amplitude distribution calculation unit and a value of normal amplitude distribution as a deflection degree of the distribution. To be more practical, the deflection degree of the distribution calculation unit estimates the normal amplitude distribution in a high amplitude area in the case where no clipping occurs from a low amplitude area of the amplitude distribution calculated by the amplitude distribution calculation unit, and calculates a difference between a value based on the amplitude distribution calculated by the amplitude distribution calculation unit in the high amplitude area and a value of the normal amplitude distribution as a deflection degree of the distribution. Otherwise, the deflection degree of the distribution calculation unit detects a peak in the amplitude distribution calculated by the amplitude distribution calculation unit, and calculates the deflection degree of the distribution on the basis of the number of peaks. Otherwise, the deflection degree of the distribution calculation unit calculates a deflection degree of the distribution on the basis of the amplitude distribution having a predetermined number or more of amplitude absolute values.

A clipping detection unit detects clipping on the basis of the deflection degree of the distribution. In the above-mentioned configuration of the present invention, the device for detecting the clipping can further include an amplitude distribution normalization unit for normalizing the amplitude distribution, and the deflection degree of the distribution calculation unit can calculate the deflection degree of the distribution on the basis of the normalized amplitude distribution. The amplitude distribution normalization unit normalizes, for example, an amplitude value in the amplitude distribution by a highest frequency value. The amplitude distribution normalization unit normalizes, for example, an amplitude value in the amplitude distribution by a maximum amplitude value.

In the above-mentioned configuration of the present invention, the device for detecting the clipping can further include an voice activity detection unit for detecting whether or not an input signal includes audio data for each of the above-mentioned predetermined periods so that a clipping detecting operation can be performed only when the voice activity detection unit detects a voice period. The voice activity detection unit detects a voice period on the basis of, for example, the amplitude distribution calculated by the amplitude distribution calculation unit.

In the above-mentioned configuration of the present invention, the device for detecting the clipping can further include a high pass filter unit for inputting an input signal to the amplitude distribution calculation unit after removing an low frequency audio component contained in the input signal.

The object and advantages of the present invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 5A and 5B illustrate the characteristics of the amplitude distribution;

FIG. 11 is a flowchart of the controlling operation of the clipping detection device according to the second embodiment of the present invention;

FIG. 14 is a flowchart of the controlling operation of the clipping detection device according to the third embodiment of the present invention;

FIG. 16 illustrates the configuration of the clipping detection device according to the fourth embodiment of the present invention;

DESCRIPTION OF EMBODIMENTS

<Description of the Common Elements>

Figure 1:
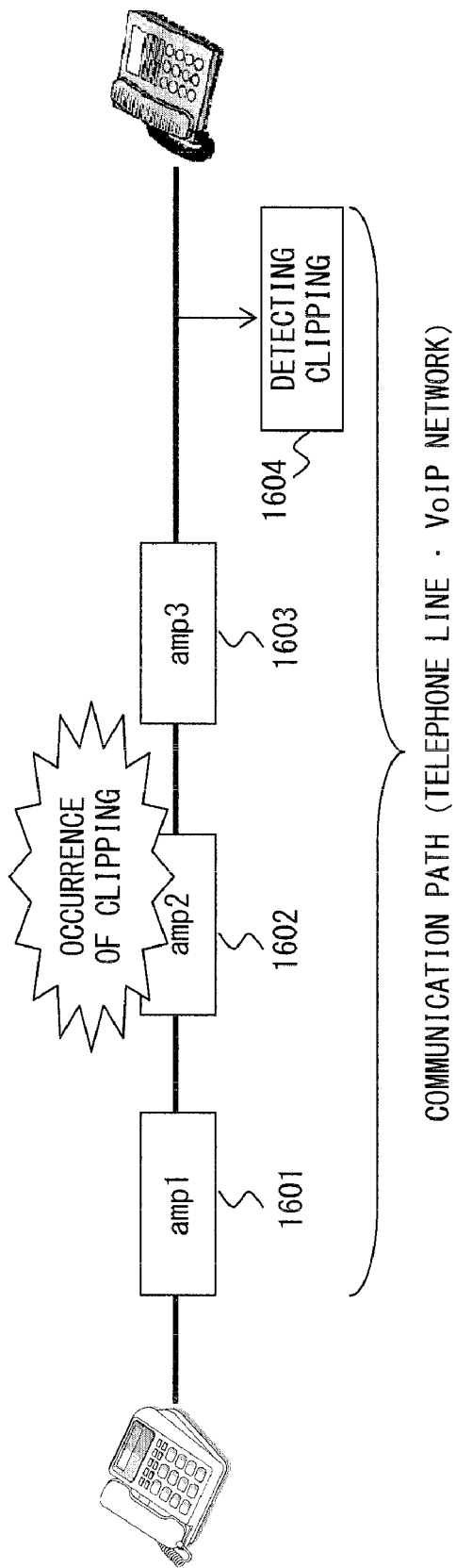
FIG. 1 is an explanatory view of clipping on a communication path.
Figure 2:
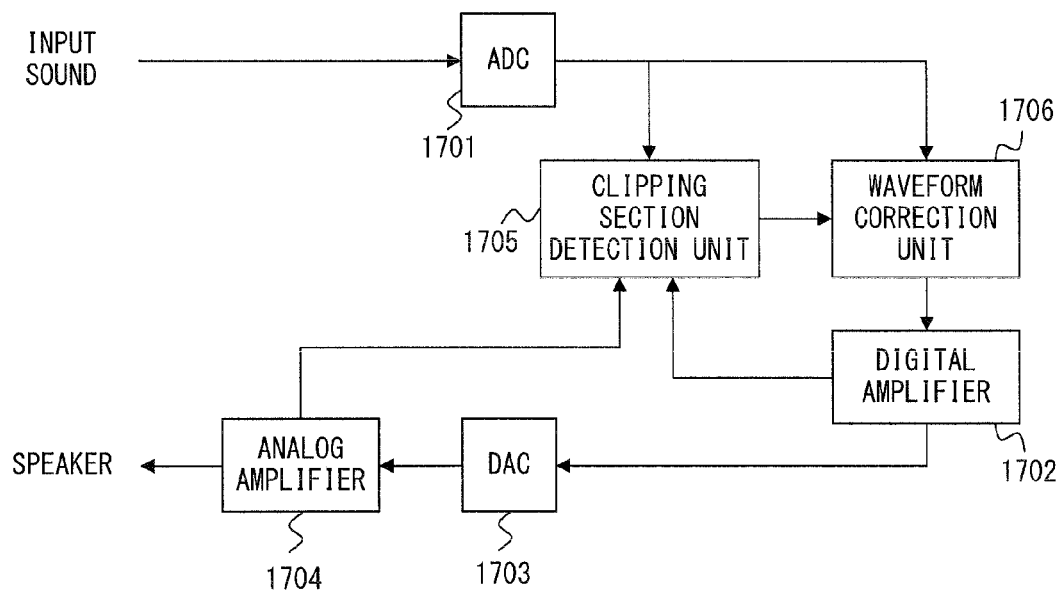
FIG. 2 illustrates the configuration of the prior art.
Figure 3:
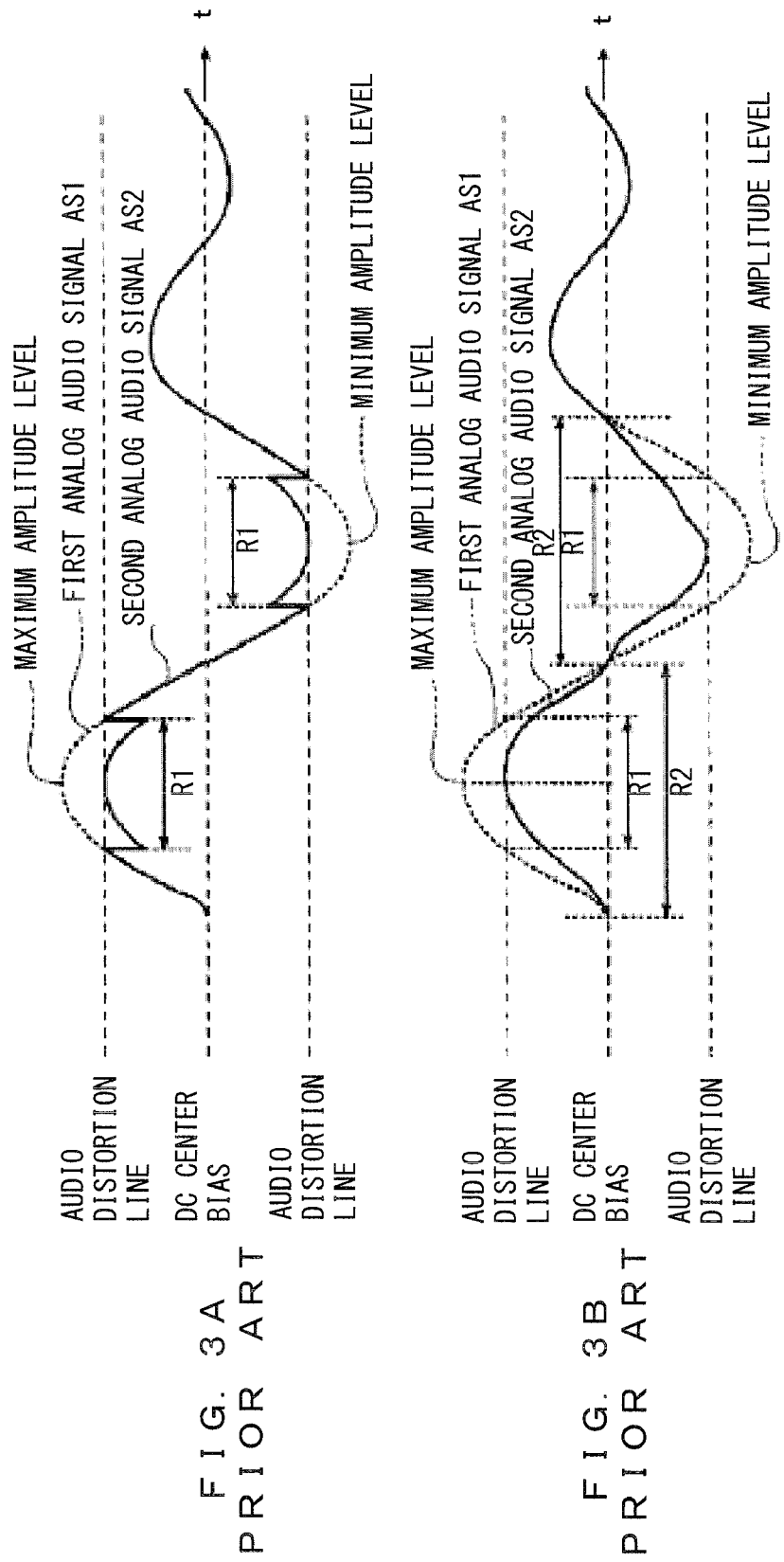
FIGS. 3A and 3B are explanatory views of the operation of the prior art.
Figure 4:
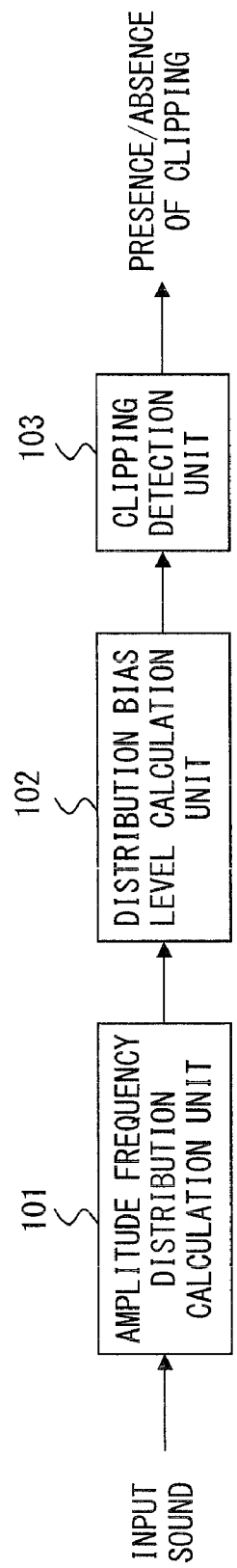
FIG. 4 illustrates the configuration of the common elements of the embodiments of the present invention.

FIG. 4 illustrates the configuration of the common elements of the embodiments of the present invention described below.

First, an amplitude distribution calculation unit 101 calculates an amplitude distribution (histogram) of input sound. Next, a deflection degree of the distribution calculation unit 102 calculates a deflection degree of the distribution from the amplitude distribution of the input sound calculated by the amplitude distribution calculation unit 101.

Figure 5B:
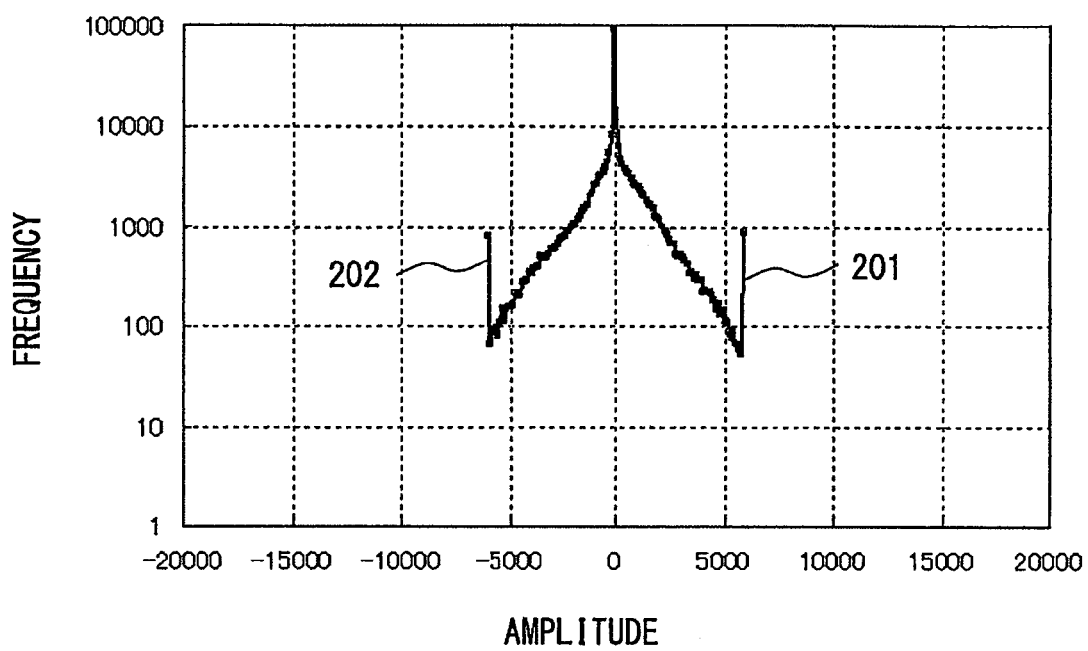

Then, a clipping detection unit 103 detects clipping when the deflection degree of the distribution calculated by the deflection degree of the distribution calculation unit 102 exceeds a predetermined threshold. When the amplitude distribution of the input sound is measured, and if no clipping has occurred, then the distribution characteristic substantially indicates the characteristic of the Gaussian distribution as illustrated in FIG. 5A. On the other hand, if clipping occurs, then the distribution characteristic indicates large frequency values especially in the high amplitude potions 201 (positive direction) and 202 (negative direction) as illustrated in FIG. 5B because the clipping causes the audio waveform to be held on the maximum amplitude value or the minimum amplitude value.

In the configuration illustrated in FIG. 4, the clipping detection unit 103 can detect clipping by the deflection degree of the distribution calculation unit 102 calculating the deflection degree of the distribution of the portions 201 and 202 illustrated in FIG. 5B.

With the configuration, clipping can be detected without the information about the amplitude level etc. of the amplifiers in the vicinity at any point of the path of telephone lines etc. On the basis of the detection result, the sound quality of telephone lines can be monitored and the gain control etc. of the communication equipment in the vicinity can be performed.

Description of the First Embodiment

Figure 6:
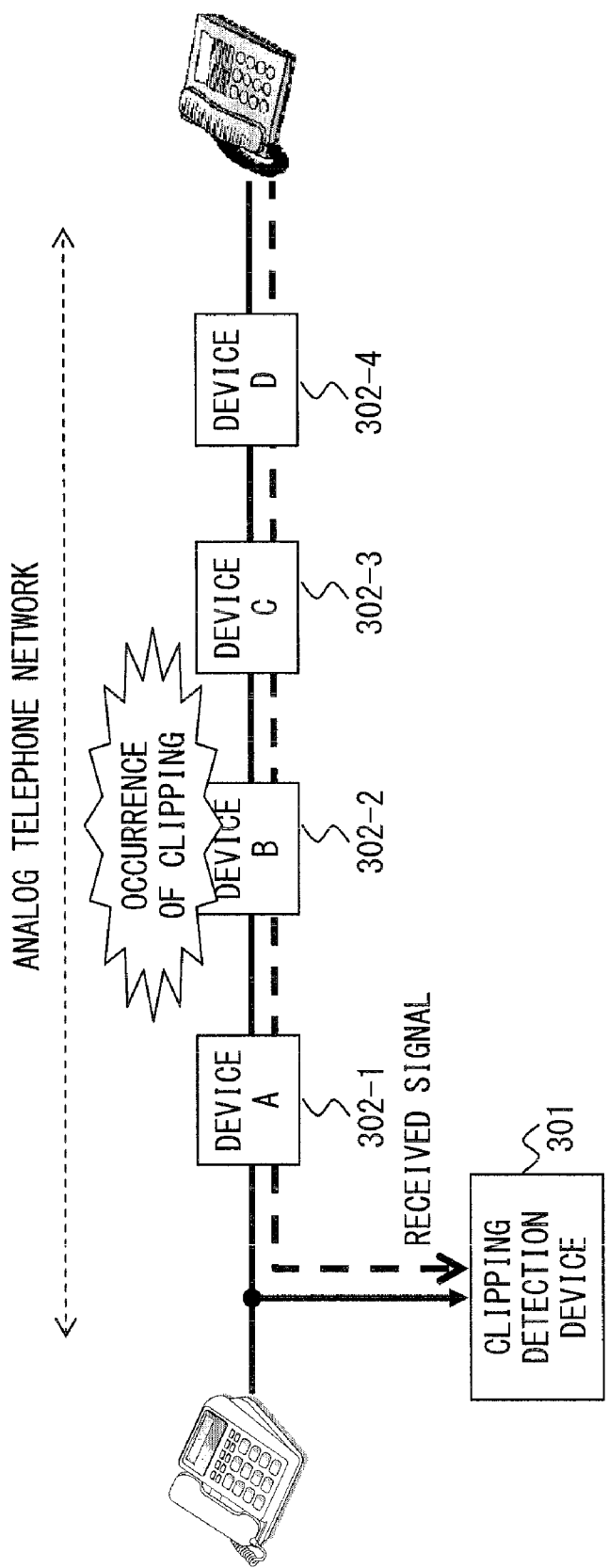
FIG. 6 illustrates an analog telephone network according to the first and fourth embodiments of the present invention.

The embodiment in which the clipping detection device realized according to the configuration as illustrated in FIG. 4 is mounted in the analog telephone network including as components a device (A) 302-1 through a device (D) 302-4, etc. as illustrated as 301 in FIG. 6, and the presence/absence of clipping is detected with respect to the received signal captured at a mounting point is described as the first embodiment.

Figure 7:
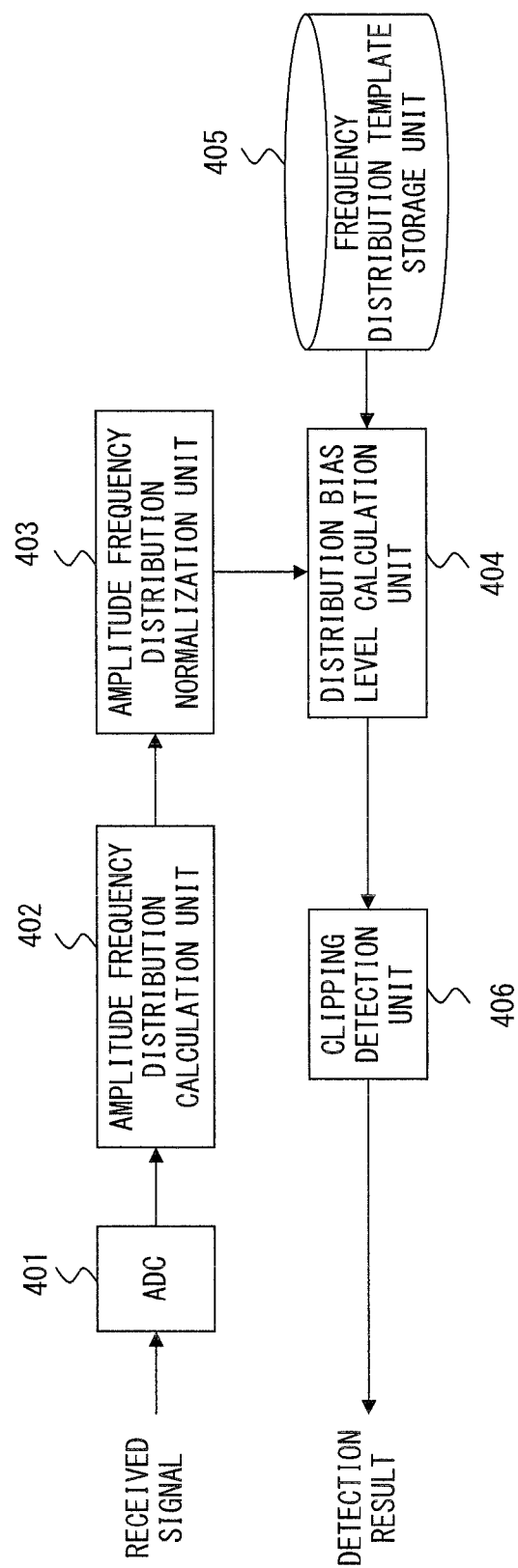
FIG. 7 illustrates the configuration of the clipping detection device according to the first embodiment of the present invention.
Figure 8:
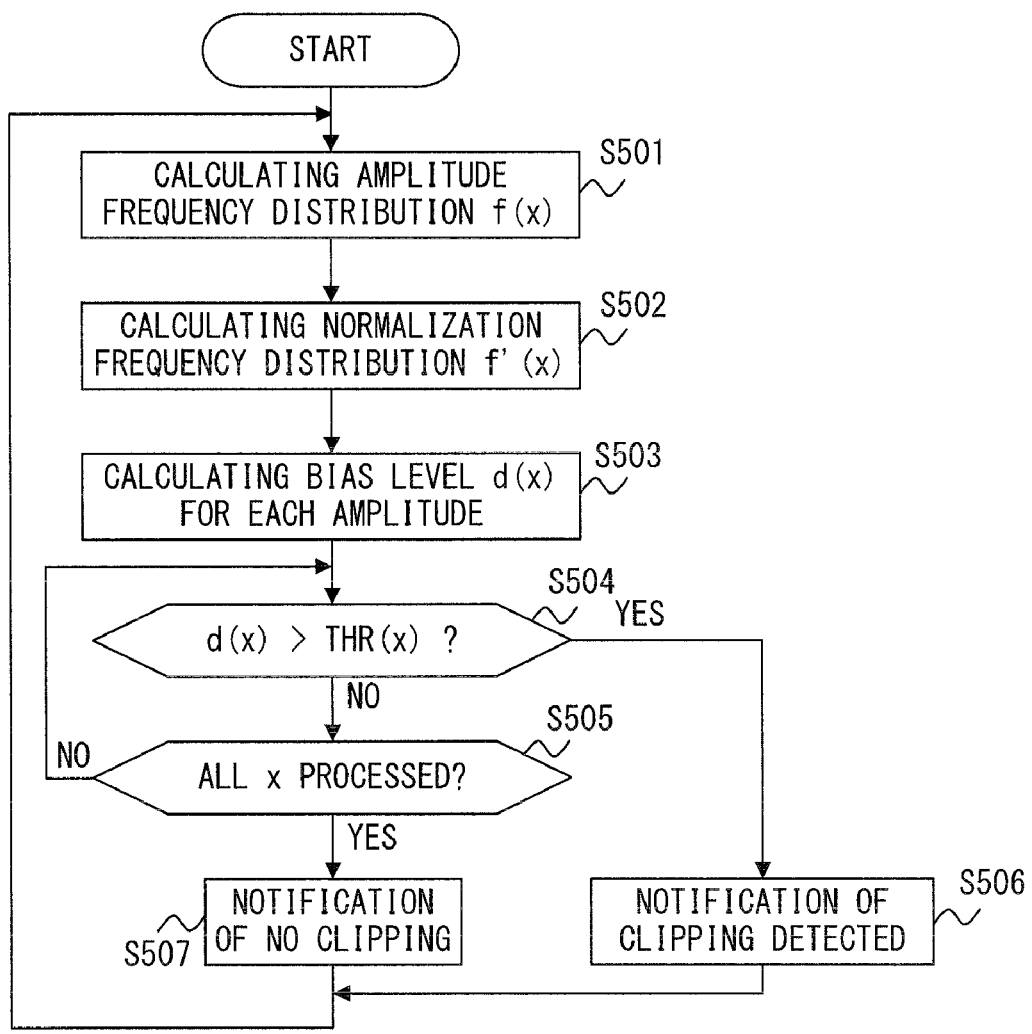
FIG. 8 is a flowchart of the controlling operation of the clipping detection device according to the first embodiment of the present invention.

FIG. 7 illustrates the configuration of the clipping detection device (301 in FIG. 6) according to the first embodiment of the present invention. FIG. 8 is a flowchart of the controlling operation realized with the configuration. First, the received signal (input sound) is converted into a digital audio signal by an ADC 401.

Next, an amplitude distribution calculation unit 402 (corresponding to 101 in FIG. 4) calculates the amplitude distribution f(x) of the digital audio signal for a predetermined period of the signal (step S501 in FIG. 8). Then, an amplitude distribution normalization unit 403 calculates a normalization frequency distribution f'(x) by performing normalization such that a highest frequency can be 1 by the following equation 1 for the amplitude distribution f(x) calculated by the amplitude distribution calculation unit 402 (step S502 in FIG. 8).

$$f'(x) = f(x)/f(x') \qquad \text{equation 1}$$

x': value for maximum frequency

Next, a deflection degree of the distribution calculation unit 404 (corresponding to 102 in FIG. 4) calculates the bias level d(x) for each amplitude x by calculating the difference between the normalization frequency distribution f'(x) calculated by the amplitude distribution normalization unit 403 and the frequency distribution template f0(x) stored in advance in a frequency distribution template storage unit 405 as indicated by the following equation 2 (step S503 in FIG. 8).

$$d(x) = f'(x) - f0(x) \qquad \text{equation 2}$$

Then, a clipping detection unit 406 (corresponding to 103 in FIG. 4) determines while searching the entire range of the amplitude x whether or not the bias level d(x) of each amplitude x is larger than the threshold THR(x) for each amplitude x (repetitive processes in steps S504→S505→S504 in FIG. 8).

The clipping detection unit 406 externally notifies of the presence of clipping when a bias level d(x) larger than the threshold THR(x) exists (step S506 in FIG. 8). On the other hand, the clipping detection unit 406 externally notifies of no clipping when a bias level d(x) larger than the threshold THR(x) does not exist, and a determination has been made on all amplitude x (step S507 in FIG. 8). After the above-mentioned processes, control is returned to the clipping detecting process in the next predetermined period (step S506 or S507→S501 in FIG. 8).

Second Embodiment

Figure 9:
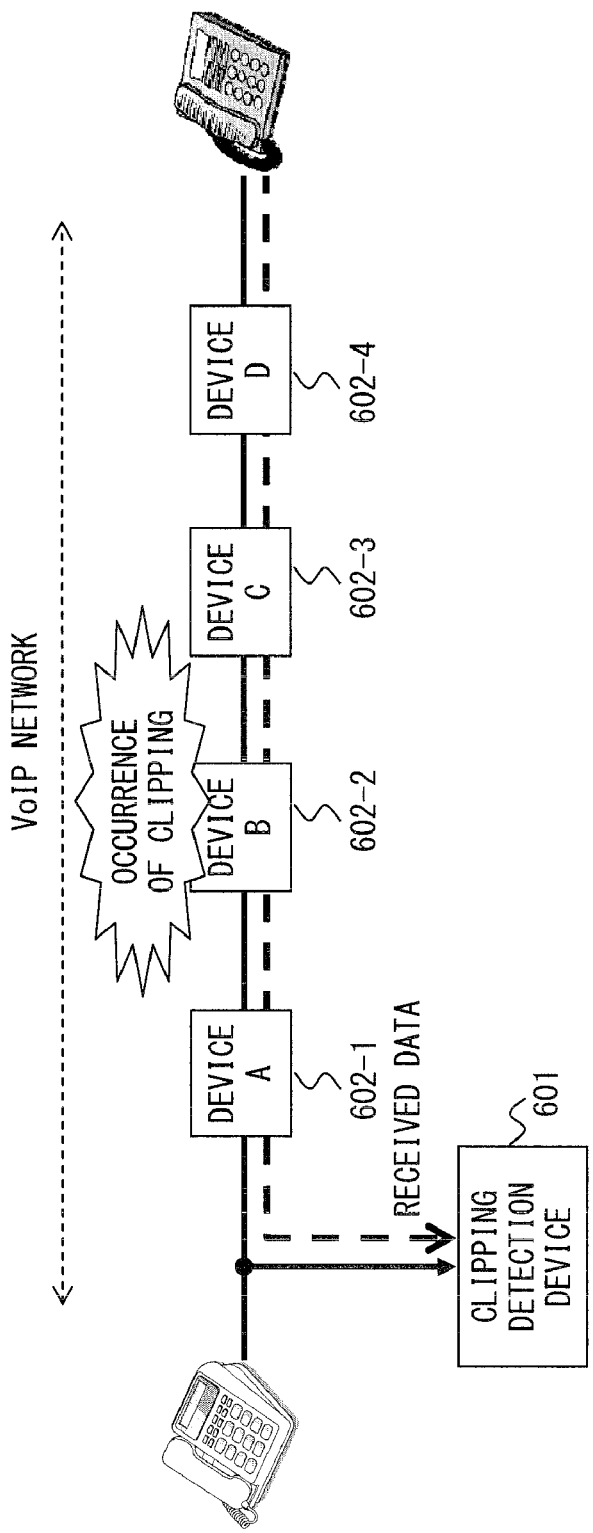
FIG. 9 illustrates a VoIP telephone network according to the second and third embodiments of the present invention.

Next, the embodiment in which the clipping detection device realized according to the configuration as illustrated in FIG. 4 is mounted in the VoIP (voice over IP) network including as components a device (A) 602-1 through a device (D) 602-4, etc. as illustrated as 601 in FIG. 9, and the presence/absence of clipping is detected with respect to the received signal captured at a mounting point is described as the second embodiment.

Figure 10:
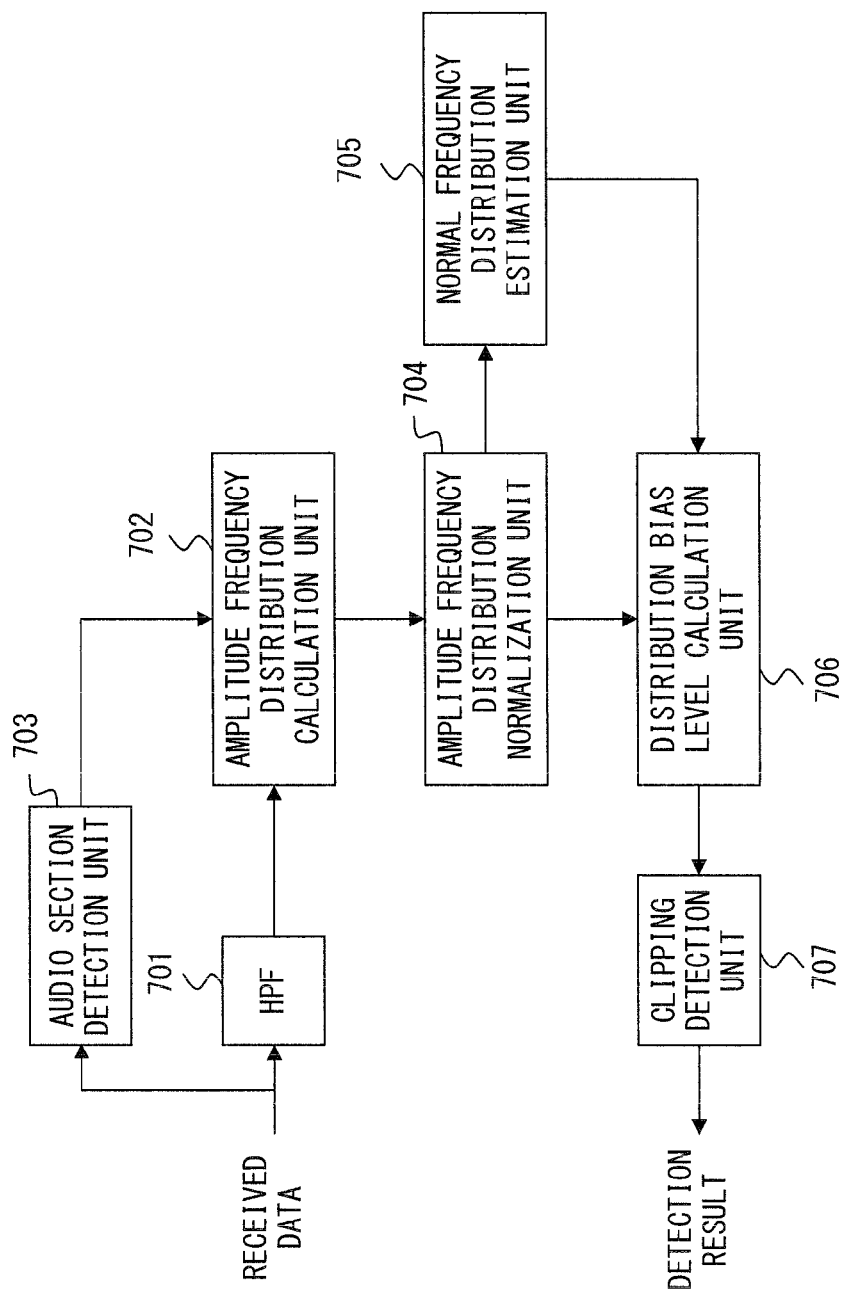
FIG. 10 illustrates the configuration of the clipping detection device according to the second embodiment of the present invention.

FIG. 10 illustrates the configuration of the clipping detection device (601 in FIG. 9) according to the second embodiment of the present invention. FIG. 11 is a flowchart of the controlling operation realized with the configuration. First, a voice activity detection unit 703 determines whether or not an audio component is contained in a predetermined period (step S801 in FIG. 11). The determination is performed on the basis of, for example, an amplitude value or a dispersion value of the power of received data.

On the other hand, the direct current offset component as a disturbance in detecting the amplitude distribution is removed from the received data by a high pass filter (HPF) 701 removing the frequency components lower than a predetermined frequency (for example, about 100 Hz) from the received data (step S802 in FIG. 11).

Next, an amplitude distribution calculation unit 702 (corresponding to 101 in FIG. 4) calculates the amplitude distribution f(x) of the received data output from the HPF 701 for each of the predetermined periods (step S803 in FIG. 11).

Then, an amplitude distribution normalization unit 704 calculates the normalization frequency distribution f(x') by performing normalization such that the absolute value of the maximum amplitude value can be 1 by the following equation 3 on the amplitude distribution f(x) calculated by the amplitude distribution calculation unit 702 (step 804 in FIG. 11).

$$f(x')=f(x/\max(x))$$ equation 3

Figure 12:
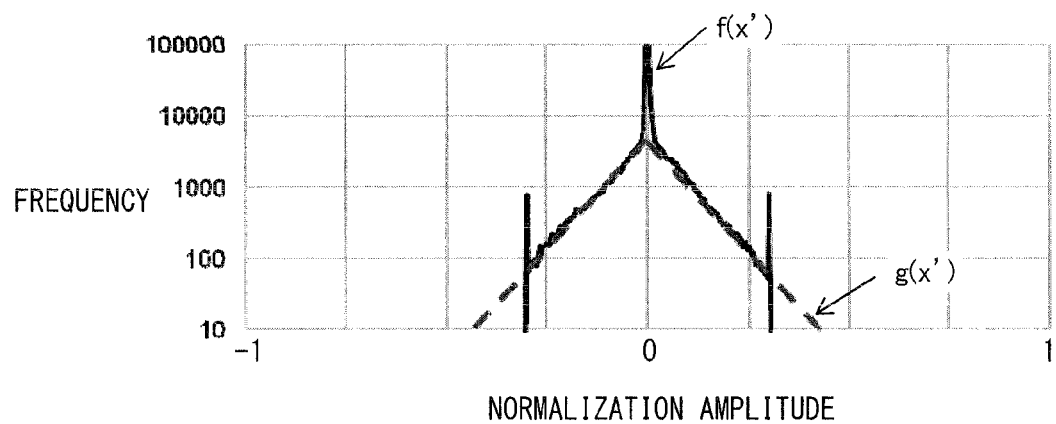
FIG. 12 is an explanatory view of the estimating operation of the normal frequency distribution according to the second embodiment of the present invention.

Next, a normal frequency distribution estimation unit 705 estimates a normal frequency distribution g(x') by performing linear approximation in the plus and minus directions from amplitude 0 on the normalization frequency distribution f(x') calculated by the amplitude distribution normalization unit 704 as illustrated in FIG. 12 (step S805 in FIG. 11).

Afterwards, a deflection degree of the distribution calculation unit 706 (corresponding to deflection degree of the distribution calculation unit 102 in FIG. 4) calculates a bias level d(x') for each amplitude x by calculating the difference between the normalization frequency distribution f(x') calculated by the amplitude distribution normalization unit 704 and the normal frequency distribution g(x') estimated by the normal frequency distribution estimation unit 705 as indicated by the following equation 4 (step S806 in FIG. 11).

$$d(x')=f(x')-g(x')$$ equation 4

A clipping detection unit 707 (corresponding to 103 in FIG. 4) determines while searching the entire range of the amplitude x whether or not the bias level d(x') of each amplitude x is larger than the threshold THR(x') for each amplitude x (repetitive processes in steps S807→S808→S807 in FIG. 11).

The clipping detection unit 707 externally notifies of the presence of clipping when a bias level d(x') larger than the threshold THR(x') exists (step S809 in FIG. 11). On the other hand, the clipping detection unit 707 externally notifies of no clipping when a bias level d(x') larger than the threshold THR(x') does not exist, and a determination has been made on all amplitude x (step S810 in FIG. 11).

After the above-mentioned processes, control is returned to the clipping detecting process in the next predetermined period (step S809 or S810→S801 in FIG. 11). In the above-mentioned second embodiment, it is not necessary to use a template for amplitude distribution when the deflection degree of the distribution is calculated.

Third Embodiment

Described below is the third embodiment. In the third embodiment, the clipping detection device realized according to the configuration as illustrated in FIG. 4 is mounted in the VoIP (voice over IP) network including as components a device (A) 602-1 through a device (D) 602-4, etc. as with the second embodiment as illustrated as 601 in FIG. 10, and the presence/absence of clipping is detected with respect to the received signal captured at a mounting point.

Figure 13:
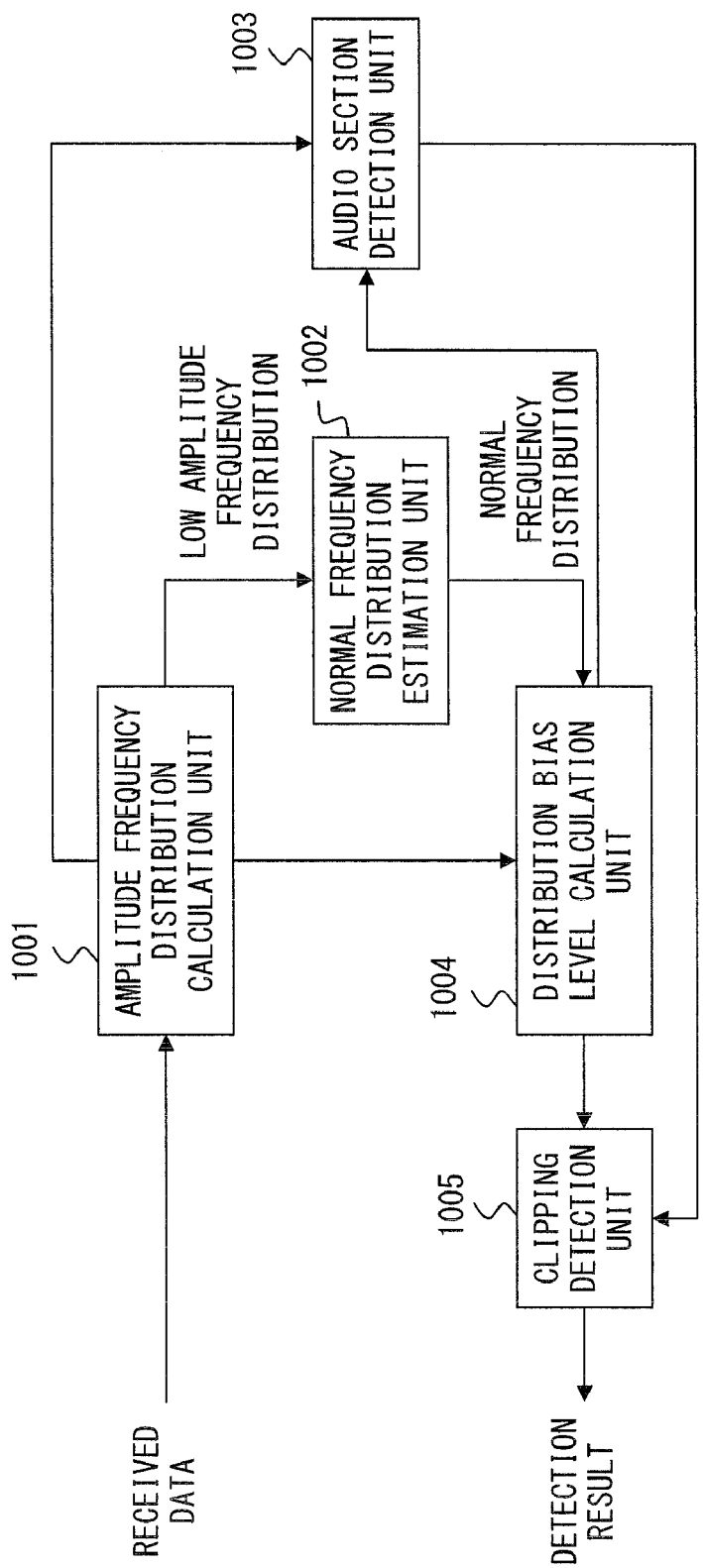
FIG. 13 illustrates the configuration of the clipping detection device according to the third embodiment of the present invention.

FIG. 13 illustrates the configuration of the clipping detection device (601 in FIG. 9) according to the third embodiment of the present invention. FIG. 14 is a flowchart of the controlling operation realized with the configuration. First, an amplitude distribution calculation unit 1001 (corresponding to 101 in FIG. 4) calculates the amplitude distribution f(x) of the digital received data for each predetermined period of the data (step S1101 in FIG. 14).

Figure 15:
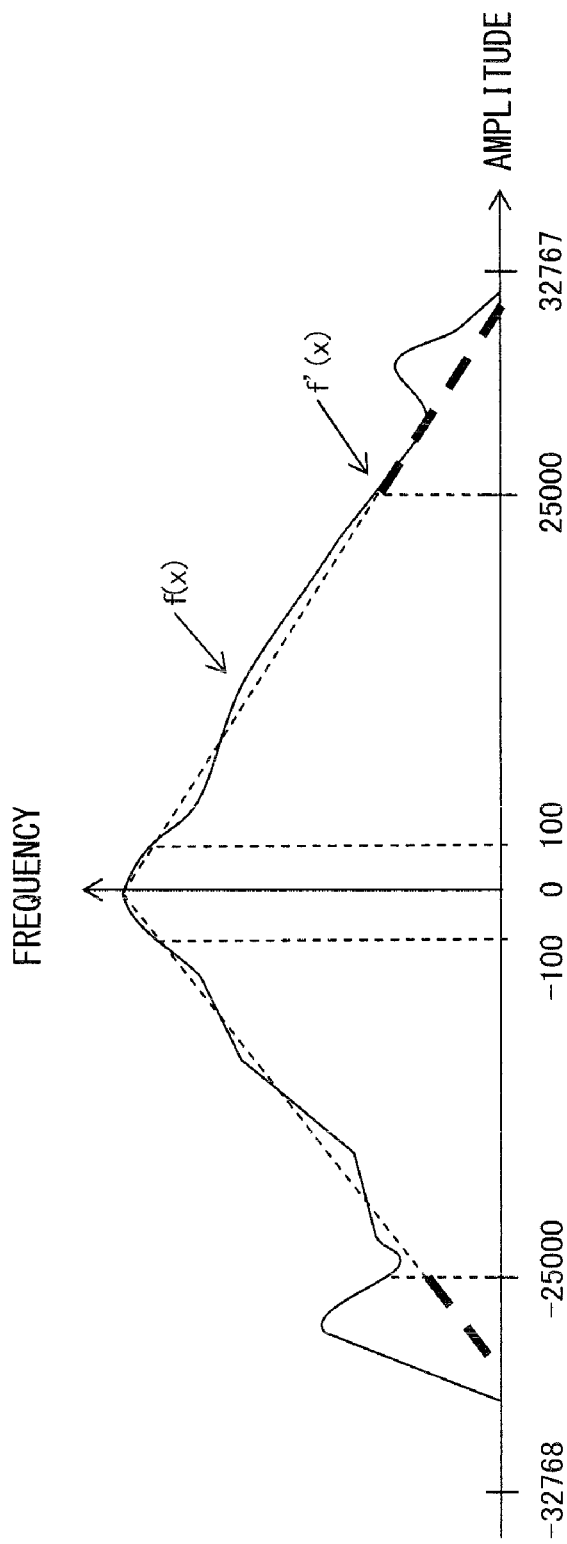
FIG. 15 is an explanatory view of the estimating operation of the normal frequency distribution according to the third embodiment of the present invention.

Next, a normal frequency distribution estimation unit 1002 estimates the frequency distribution f'(x) in a high amplitude area in the plus direction at the amplitude of 25000 or more using the frequency distribution in a low amplitude area in the plus direction at the amplitude of 100 through 25000 when it is assumed that no clipping occurs as illustrated in FIG. 15, and simultaneously estimates the frequency distribution f'(x) obtained by extending the estimation result in the high amplitude area in the plus direction to the low amplitude area in the plus direction, and the estimated results are added up as the normalization frequency distribution f'(x) in the plus direction. Practically, for example, straight line having the minimum square error from the frequency distribution at the amplitude of 100 through 25000 is calculated as the normalization frequency distribution f'(x) (step S1102 in FIG. 14).

Similarly, a normal frequency distribution estimation unit 1002 estimates the frequency distribution f'(x) in a high amplitude area in the minus direction at the amplitude of −25000 or less using the frequency distribution in a low amplitude area in the minus direction at the amplitude of −100 through −25000 when it is assumed that no clipping occurs as illustrated in FIG. 15, and simultaneously estimates the frequency distribution f'(x) obtained by extending the estimation result in the high amplitude area in the minus direction to the low amplitude area in the minus direction, and the estimated results are added up as the normalization frequency distribution f'(x) in the minus direction (step S1102 in FIG. 14).

Then, a deflection degree of the distribution calculation unit 1004 (corresponding to 102 in FIG. 4) calculates the difference between the amplitude distribution f(x) calculated by the amplitude distribution calculation unit 1001 and the normalization frequency distribution f'(x) estimated by the normal frequency distribution estimation unit 1002 by the following equation 5 in the high amplitude area of the amplitude value of 25000 or more or −25000 or less, thereby calculating the bias level d(x) of each amplitude x in the high amplitude area (step S1103 in FIG. 14).

$$d = \sum_{x=25000}^{32767} (f(x) - f'(x)) + \sum_{x=-32768}^{-25000} (f(x) - f'(x)) \quad \text{equation 5}$$

In addition, the deflection degree of the distribution calculation unit 1004 calculates the difference between the amplitude distribution f(x) calculated by the amplitude distribution calculation unit 1001 and the normalization frequency distribution f'(x) estimated by the normal frequency distribution estimation unit 1002 by the following equation 6 in the low amplitude area of the amplitude value of 100 or more and 25000 or less or −100 or less and −25000 or more, thereby calculating the bias level d'(x) of each amplitude x in the low amplitude area. Then, a voice activity detection unit 1003 compares the bias level d'(x) of each amplitude x in the low amplitude area with a predetermined threshold of each amplitude x, thereby outputting "no sound" when one or a predetermined number the bias level d'(x) exceed a threshold, and outputs "sound detected" when the threshold is not exceeded (step S1104 in FIG. 14).

$$d' = \sum_{x=100}^{25000} (f(x) - f'(x)) + \sum_{x=-25000}^{-100} (f(x) - f'(x)) \quad \text{equation 6}$$

When the voice activity detection unit 1003 outputs "sound detected", a clipping detection unit 1005 (corresponding to 103 in FIG. 4) determines while searching the high amplitude area at the amplitude value of 25000 or more or −25000 or less for the amplitude x whether or not the bias level d(x) of each amplitude x is larger than the threshold THR(x) of each amplitude x (repetitive processes in step S1105→S1106→S1105 in FIG. 14).

The clipping detection unit 1005 externally notifies of the presence of clipping when there is the bias level d(x) higher than the threshold THR(x) (step S1107 in FIG. 14). On the other hand, the clipping detection unit 1005 externally notifies of no clipping when there is no bias level d(x) higher than the threshold THR(x), and the determination has been completed on all amplitude x (step S1108 in FIG. 14).

After the above-mentioned processes, control is returned to the clipping detecting process in the next period (step S1107 or S1108→S1101). In the third embodiment, as with the second embodiment, it is not necessary to prepare a template of the amplitude distribution when the deflection degree of the distribution is calculated, and a normal frequency distribution in the high amplitude area can be estimated with high precision from the amplitude distribution in the low amplitude area.

Fourth Embodiment

Finally described below is the fourth embodiment. In the fourth embodiment, the clipping detection device realized according to the configuration as illustrated in FIG. 4 is mounted in the analog telephone network including as components a device (A) 302-1 through a device (D) 302-4, etc. as with the first embodiment as illustrated as 301 in FIG. 6, and the presence/absence of clipping is detected with respect to the received signal captured at a mounting point.

Figure 17:
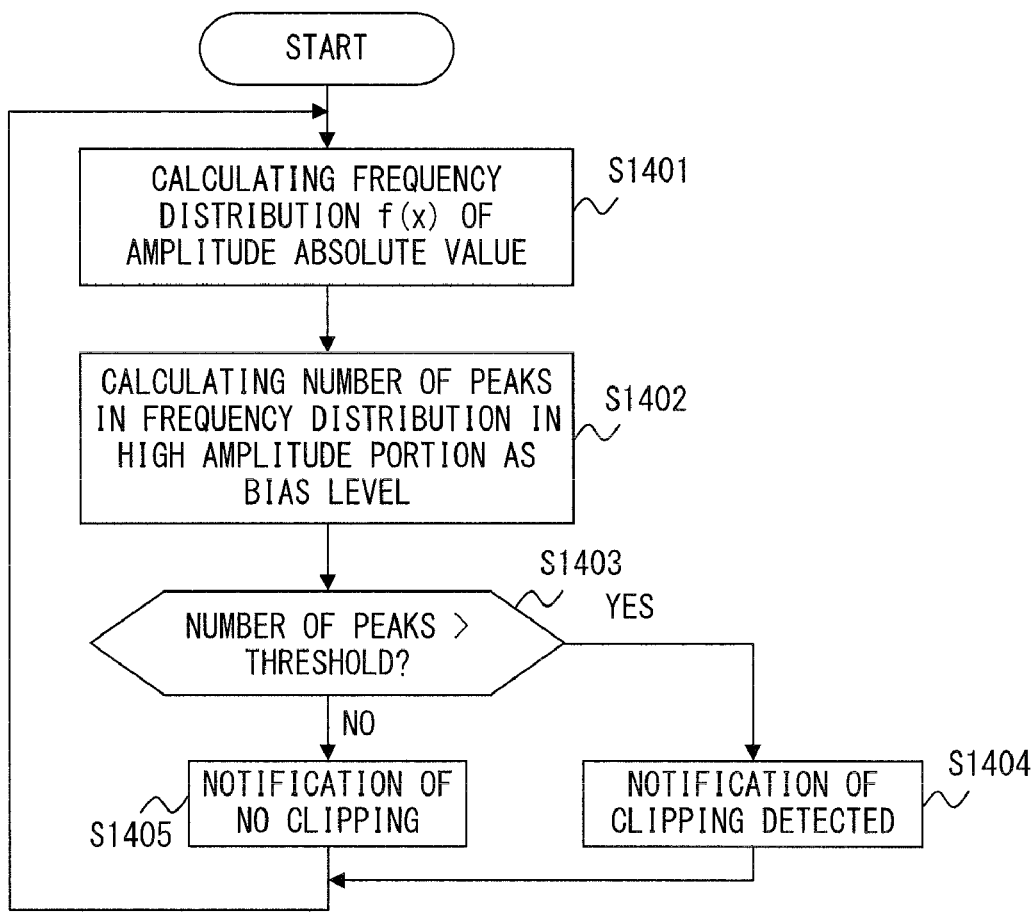
FIG. 17 is a flowchart of the controlling operation of the clipping detection device according to the fourth embodiment of the present invention.

FIG. 16 illustrates the configuration of the clipping detection device (301 in FIG. 6) according to the fourth embodiment of the present invention. FIG. 17 is a flowchart of the controlling operation realized with the configuration. First, a received signal (input sound) is converted into a digital audio signal by an ADC 1301.

Next, an amplitude distribution calculation unit 1302 (corresponding to 101 in FIG. 4) calculates the frequency distribution f(x) of an absolute value of the amplitude of the digital audio signal for each predetermined period of the signal (step S1401 in FIG. 17).

Figure 18:
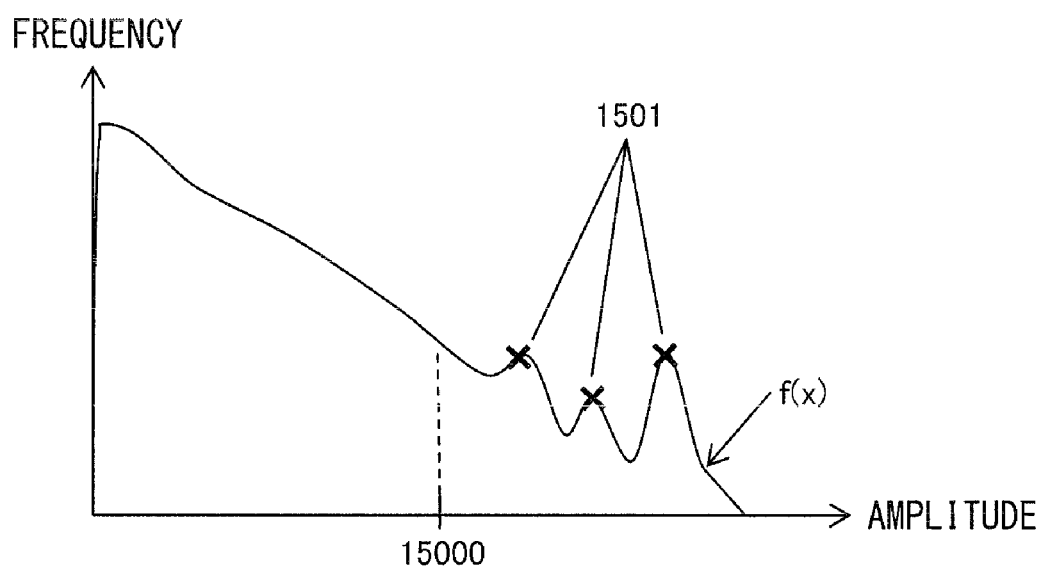
FIG. 18 is an explanatory view of an operation of calculating a deflection degree of the distribution according to the fourth embodiment of the present invention.

Next, a deflection degree of the distribution calculation unit 1303 (corresponding to 102 in FIG. 4) analyzes the frequency distribution of the absolute value of the amplitude calculated by the amplitude distribution calculation unit 1302, and calculates the number of peaks (maximum value) in the frequency distribution in the high amplitude area of the amplitude absolute value of 15000 or more as the frequency bias level as illustrated as 1501 in FIG. 18 (step S1402 in FIG. 17). That is, a peak refers to f(x) in $$f(x) > f(x-1) \text{ and } f(x) \le f(x+1)$$

Then, a clipping detection unit 1304 (corresponding to 103 in FIG. 4) externally notifies of the presence of clipping when the number of peaks calculated by the deflection degree of the distribution calculation unit 1303 is larger than a predetermined threshold (step S1403→S1404 in FIG. 17).

On the other hand, the clipping detection unit 1304 externally notifies of no clipping when the number of peaks calculated by the deflection degree of the distribution calculation unit 1303 is a predetermined threshold or less (step S1403→S1405 in FIG. 17).

After the processes above, control is returned to the clipping detecting process in the next predetermined period (step S1404 or S1405→S1401 in FIG. 17). In the above-mentioned fourth embodiment, the deflection degree of the distribution can be easily detected on the basis of the findings that some peaks easily occur in the frequency distribution of the amplitude absolute value in the high amplitude area when clipping occurs.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:
1. A clipping detection device which detects clipping of a communication signal, the clipping detection device comprising:
an amplitude distribution calculation device to calculate amplitude distribution of an input signal for each predetermined period;

a deflection degree of the distribution calculation device to calculate a deflection degree of the distribution on a basis of the amplitude distribution; and a clipping detection device to detect clipping on a basis of the deflection degree of the distribution, wherein the deflection degree of the distribution calculation device estimates normal amplitude distribution in a high amplitude area in the case when no clipping occurs from a low amplitude area of the amplitude distribution calculated by the amplitude distribution calculation device, and calculates a difference between a value on a basis of the amplitude distribution calculated by the amplitude distribution calculation device in the high amplitude area and a value of the normal amplitude distribution as the deflection degree of the distribution.

2. The device according to claim 1, further comprising an amplitude distribution normalization device to normalize the amplitude distribution, wherein the deflection degree of the distribution calculation device calculates the deflection degree of the distribution on a basis of the normalized amplitude distribution.

3. The device according to claim 1, wherein the deflection degree of the distribution calculation device calculates a difference between a value on a basis of the amplitude distribution calculated by the amplitude distribution calculation device and a value of a predetermined amplitude distribution as the deflection degree of the distribution.

4. The device according to claim 1, wherein the deflection degree of the distribution calculation device detects a peak in the amplitude distribution calculated by the amplitude distribution calculation device, and calculates the deflection degree of the distribution on a basis of a number of the peaks.

5. The device according to claim 1, further comprising a voice activity detection device detecting a voice period in which audio data is include for each of the predetermined periods in the input signal, wherein a clipping detecting operation is performed only when the voice activity detection device detects the voice period.

6. The device according to claim 1, wherein the deflection degree of the distribution calculation device calculates the deflection degree of the distribution on a basis of the amplitude distribution having an amplitude absolute value equal to or exceeding a predetermined value.

7. A method for detecting clipping of a communication signal, the method comprising:

calculating amplitude distribution of an input signal for each predetermined period;

calculating a deflection degree of the distribution on a basis of the amplitude distribution; and detecting clipping on a basis of the deflection degree of the distribution, wherein the calculating the deflection degree of the distribution estimates normal amplitude distribution in a high amplitude area in the case when no clipping occurs from a low amplitude area of the amplitude distribution, and calculates a difference between a value on a basis of the amplitude distribution in the high amplitude area and a value of the normal amplitude distribution as the deflection degree of the distribution.

8. The method according to claim 7, further comprising normalizing the amplitude distribution, wherein the calculating the deflection degree of the distribution calculates a deflection degree of the distribution on a basis of the normalized amplitude distribution.

9. The method according to claim 7, wherein the calculating the deflection degree of the distribution calculates a difference between a value on a basis of the amplitude distribution and a predetermined value of amplitude distribution as the deflection degree of the distribution.

10. The method according to claim 7, wherein the calculating the deflection degree of the distribution detects a peak in the amplitude distribution and calculates the deflection degree of the distribution on a basis of the number of peaks.

11. The method according to claim 7, further comprising detecting a voice period where the input signal includes audio data for each of the predetermined periods, wherein a clipping detecting operation is performed only when the voice period is detected.

12. The method according to claim 7, wherein the calculating the deflection degree of the distribution calculates the deflection degree of the distribution on a basis of the amplitude distribution having an amplitude absolute value equal to or exceeding a predetermined value.

* * * * *